(12) United States Patent
Kim

(10) Patent No.: US 10,199,357 B2
(45) Date of Patent: Feb. 5, 2019

(54) SEMICONDUCTOR PACKAGE

(71) Applicant: SK hynix Inc., Icheon-si and Gyeonggi-do (KR)

(72) Inventor: Yeon Ok Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 34 days.

(21) Appl. No.: 15/462,039

(22) Filed: Mar. 17, 2017

(65) Prior Publication Data

US 2017/0186734 A1 Jun. 29, 2017

Related U.S. Application Data

(63) Continuation-in-part of application No. 14/284,886, filed on May 22, 2014.

(30) Foreign Application Priority Data

Mar. 24, 2014 (KR) .......................... 10-2014-0034034

(51) Int. Cl.
*H01L 25/00* (2006.01)
*H01L 25/065* (2006.01)
(Continued)

(52) U.S. Cl.
CPC ...... *H01L 25/0657* (2013.01); *H01L 23/3107* (2013.01); *H01L 23/32* (2013.01); *H01L 23/522* (2013.01); *H01L 23/585* (2013.01); *H01L 25/0652* (2013.01); *H01L 23/5256* (2013.01); *H01L 24/16* (2013.01);
(Continued)

(58) Field of Classification Search
CPC ............... H01L 25/0657; H01L 23/585; H01L 23/3107; H01L 2225/06568; H01L 2225/06541; H01L 23/3114; H01L 2225/06582; H01L 2224/04105; H01L 2224/12105; H01L 2224/28105; H01L 24/01; H01L 2224/01; H01L 29/0623

See application file for complete search history.

(56) References Cited

U.S. PATENT DOCUMENTS

| 2008/0191205 A1 | 8/2008 | Tsai et al. |
| 2008/0290492 A1* | 11/2008 | Chung ................ H01L 23/3128 |
| | | 257/686 |
| 2009/0294912 A1 | 12/2009 | Chibahara et al. |
| 2011/0132652 A1 | 6/2011 | Ding et al. |

(Continued)

FOREIGN PATENT DOCUMENTS

| CN | 101593738 A | 12/2009 |
| CN | 101635162 A | 1/2010 |

(Continued)

*Primary Examiner* — Cuong B Nguyen
*Assistant Examiner* — Samuel Park
(74) *Attorney, Agent, or Firm* — William Park & Associates Ltd.

(57) ABSTRACT

A semiconductor package includes a first chip, a second chip stacked over the first chip and having a different size from the first chip, a first guard unit formed in an edge of a chip having a relatively small size of the first chip and the second chip, and a second guard unit formed in an edge of a chip having a relatively large size of the first chip and the second chip. The first guard unit includes an extension pad which expands the size of the chip having the relatively small size to the size of the chip having the relatively large size.

8 Claims, 9 Drawing Sheets

(51) Int. Cl.
  *H01L 23/58* (2006.01)
  *H01L 23/31* (2006.01)
  *H01L 23/32* (2006.01)
  *H01L 23/522* (2006.01)
  *H01L 23/525* (2006.01)
  *H01L 23/00* (2006.01)
  *H01L 27/06* (2006.01)

(52) U.S. Cl.
  CPC *H01L 27/0688* (2013.01); *H01L 2224/16145* (2013.01); *H01L 2224/16225* (2013.01); *H01L 2225/06541* (2013.01); *H01L 2225/06555* (2013.01); *H01L 2225/06568* (2013.01); *H01L 2225/06582* (2013.01); *H01L 2225/06596* (2013.01); *H01L 2924/00014* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 2011/0309475 A1* | 12/2011 | Lee | G11C 5/025 257/532 |
| 2012/0003809 A1 | 1/2012 | Kim | |
| 2013/0087891 A1 | 4/2013 | Kang et al. | |
| 2013/0091315 A1 | 4/2013 | Ken et al. | |
| 2014/0084445 A1* | 3/2014 | Lin | H01L 23/3677 257/698 |
| 2015/0008417 A1* | 1/2015 | Ochi | H01L 51/5281 257/40 |
| 2015/0097271 A1 | 4/2015 | Ayotte et al. | |

FOREIGN PATENT DOCUMENTS

| | | |
|---|---|---|
| CN | 103117270 A | 5/2013 |
| KR | 1020050024669 A | 3/2005 |
| KR | 1020050097142 A | 10/2005 |

* cited by examiner

SEMICONDUCTOR PACKAGE

CROSS-REFERENCES TO RELATED APPLICATION

The present application is a continuation-in-part application of U.S. application Ser. No. 14/284,886, filed on May, 22, 2014, and claims priority under 35 U.S.C. § 119(a) to Korean application number 10-2014-0034034, filed on Mar. 24, 2014, in the Korean Intellectual Property Office, which is incorporated herein by reference in its entirety.

BACKGROUND

1. Technical Field

Various embodiments relate to a semiconductor package, and more particularly, to a semiconductor package having a through silicon via (TSV).

2. Related Art

Recently, with the requirement of high integration and high capacity of semiconductor products, a structure having a plurality of semiconductor chips stacked in a vertical direction has been proposed. Representative examples of the structure having a plurality of semiconductor chips stacked in a vertical direction may include a structure having a plurality of semiconductor chips stacked through TSVs.

The plurality of semiconductor chips stacked through TSVs may be packaged for commercialization. The semiconductor package refers to a structure which is sealed with mold resin or ceramic such that the semiconductor chips having micro circuits formed therein are protected from outside and mounted in an electronic device.

SUMMARY

In an embodiment, a semiconductor package may include a first chip; a second chip stacked over the first chip and having a different size from the first chip; a first guard unit formed in an edge of a chip having a relatively small size of the first chip and the second chip; and a second guard unit formed in an edge of a chip having a relatively large size of the first chip and the second chip. The first guard unit may include an extension pad which expands the size of the chip having the relatively small size to the size of the chip having the relatively large size.

In an embodiment, a semiconductor package may include a package substrate; a master chip mounted on the package substrate; a plurality of slave chips stacked over the master chip and having a size larger than that of the master chip; through silicon vias (TSVs) formed through insides of the master chip and the plurality slave chips; a first guard unit formed to surround an edge of the master chip; and a second guard unit formed to surround the plurality of slave chips. The first guard unit may include an extension pad which expands an area of the master chip to an area of the slave chips.

DETAILED DESCRIPTION

Hereinafter, a semiconductor package according to the invention will be described below with reference to the accompanying figures through various embodiments. In order to package the plurality of semiconductor chips stacked through TSVs, a molding process must be performed. During the molding process, however, a crack may occur in the semiconductor chips or the reliability of the semiconductor chips may be degraded by moisture. Various embodiments are directed to a semiconductor package which includes two or more guard units so as to improve the reliability thereof.

Figure 1:
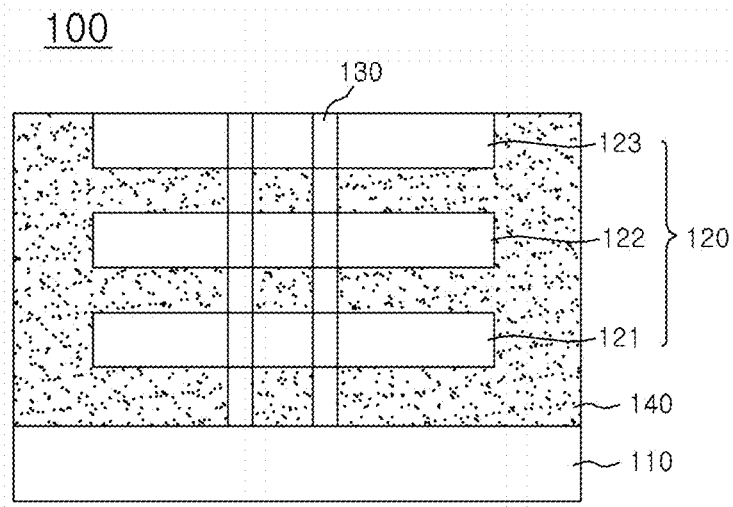
FIG. 1 is a diagram illustrating the structure of a semiconductor package according to an embodiment of the invention.

Referring to FIG. 1, the semiconductor package 100 invention may include a master chip 110, first to third slave chips 121 to 123, a through silicon via (TSV) 130, and a molding part 140. The first to third slave chips 121 to 123 may be configured to be stacked over the master chip 110. The TSV 130 may be formed through the first to third slave chips 121 to 123. The molding part 140 may be configured to cover the top surface of the master chip 110 including the plurality of slave chips 120, to protect the plurality of slave chips 120 from the external environment. The master chip 100 may be configured to have a larger size than the plurality of slave chips 200. This is because the semiconductor package 100 according to an embodiment of the invention includes two or more guard units to prevent a package defect caused by moisture or crack. Further, a second guard unit among the guard units is disposed at the master chip 110.

Figure 2:
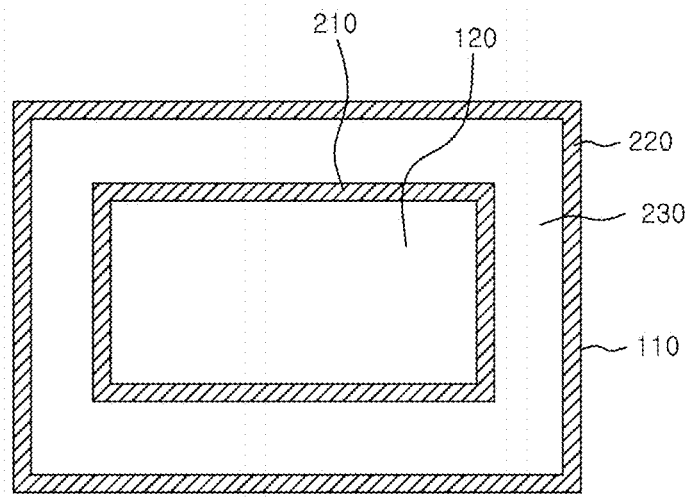
FIG. 2 is a diagram illustrating a first guard unit, a second guard unit, and a dummy pattern part of the semiconductor package according to an embodiment of the invention.

Referring to FIG. 2, the semiconductor package 100 according to an embodiment may further include a first guard unit 210, a second guard unit 220, and a dummy pattern part 230, in addition to the components illustrated in FIG. 1.

The first guard unit 210 may be configured to be formed at the outermost part of the first to third slave chips 121 to 123 to protect the respective slave chips 120.

The second guard unit 220 may be formed at the outermost part of the master chip 110. More specifically, the second guard unit 220 may be configured to be disposed at a first distance from the first guard unit 210 and formed over the outermost part of the master chip 110. The second guard unit 220 may be configured to be formed to such a height to ensure that the plurality of slave chips 120 are stacked. The first distance may correspond to a difference in size between the master chip 110 and the plurality of slave chips 120. In an embodiment, the second guard unit 220 may be formed at the outermost part of the master chip 110, but the invention is not limited thereto to such a configuration. More specifically, the second guard unit 220 may not be formed at the outermost part of the master chip 110, but formed at a predetermined distance from the first guard unit 210. The predetermined distance may correspond to a difference in size between the master chip 110 and the slave chips 120. However, when the second guard unit 220 is not formed at the outermost part of the master chip 110 but formed so that the distance between the first and second guard unit 210 and 220 is small, additional dummy patterns may be formed to make up for the difference in size between the master chip 110 and the plurality of slave chips 120.

Figure 3:
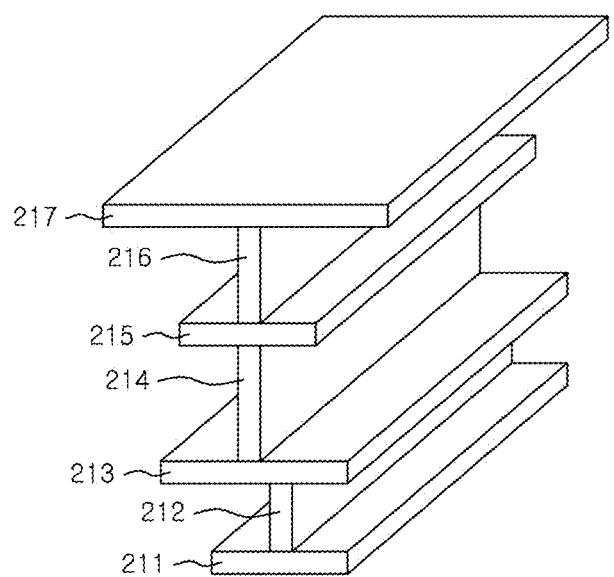
FIG. 3 is a diagram illustrating the structure of the first and second guard units of the semiconductor package according to an embodiment of the invention.

Referring to FIG. 3, the structure of the first guard unit 210 will be described in more detail. The first guard unit 210 may be configured to include an active layer 211, a first metal contact barrier layer 212, a first metal layer 213, a second metal contact barrier layer 214, a second metal layer 215, a third metal contact barrier layer 216, and a third metal layer 217. The first metal contact barrier layer 212 may be configured to be vertically formed over the active layer 211. The first metal layer 213 may be horizontally formed over the first metal contact barrier layer 212. The second metal contact barrier layer 214 may be vertically formed over the first metal layer 213. The second metal layer 215 may be horizontally formed over the second metal contact barrier layer 214. The third metal contact barrier layer 216 may be vertically formed over the second metal layer 215. Further, the third metal layer 217 may be horizontally formed over the second metal contact barrier layer 216. The second guard unit 220 may be configured to have the same structure as the first guard unit 210.

Figure 4A:
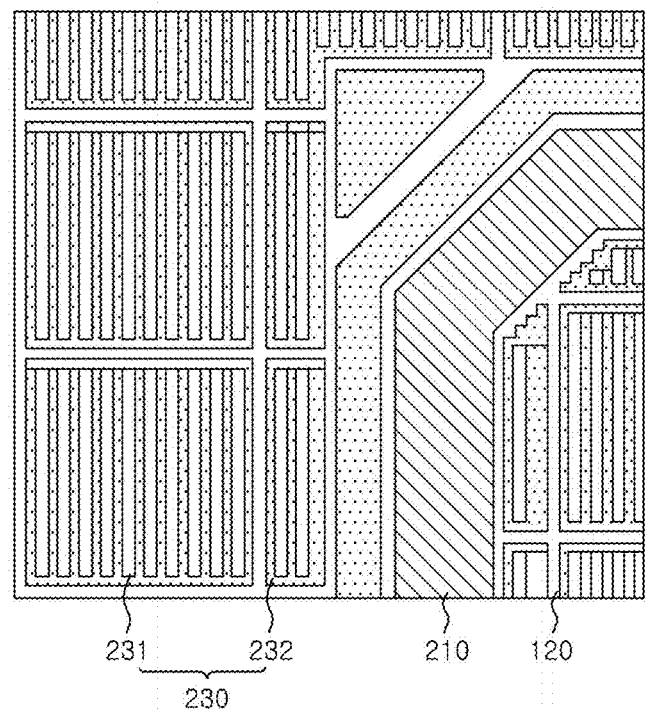
FIGS. 4A and 4B are diagrams illustrating the structure of the dummy pattern part of the semiconductor package according to an embodiment of the invention.
Figure 4B:
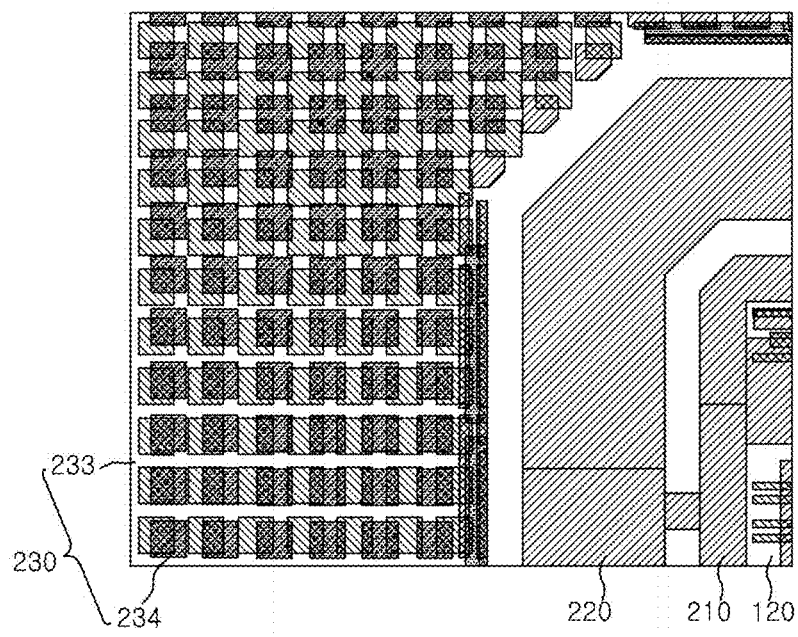

The dummy pattern part 230 may be disposed for each layer so that a level difference is not formed between the first and second guard units 210 and 220. Furthermore, the dummy pattern part 230 may be disposed for each layer at the outermost part to make up for the difference in size between the master chip 110 and the slave chips 120. Referring to FIGS. 4A and 4B, FIG. 4A illustrates the dummy pattern part 230 formed between the first and second guard units 210 and 220. In addition, FIG. 4B illustrates the dummy pattern part 230 formed to make up for a difference in size between the master chip 110 and the slave chips 120 when the first and second guard units 210 and 220 are formed without distance provided therebetween. First, the structure of the dummy pattern part 230 will be described in FIG. 4A. The dummy pattern part 230 of the semiconductor package 100 according to an embodiment of the invention may include dummy metal patterns 232 formed over insulation layers 231 to insulate the respective slave chips 121 to 123 over the master chip 110. In other words, the dummy pattern part 230 may be formed in the molding part 140 for the slave chips 121 to 123. The dummy metal pattern 232 may be configured to include vertical bar-shaped patterns having a predetermined width. The dummy metal pattern 232 may also include one or more of an ISO and a gate.

Referring to FIG. 4B, the dummy pattern part 230 may include dummy metal patterns 234 formed over insulation layers 233 to insulate the respective slave chips 121 to 123 over the master chip 110. The dummy metal patterns 234 may include box-shaped or bar-shaped patterns. Furthermore, the dummy metal patterns 234 may also include metal lines.

The dummy pattern part 230 formed in such a manner may be used as either a test circuit or fuse circuit.

The structure including two or more guard units may also be applied to a semiconductor package referred to as a system package wherein a plurality of semiconductor chips having different functions are packaged and sealed so as to implement a system.

Figure 5:
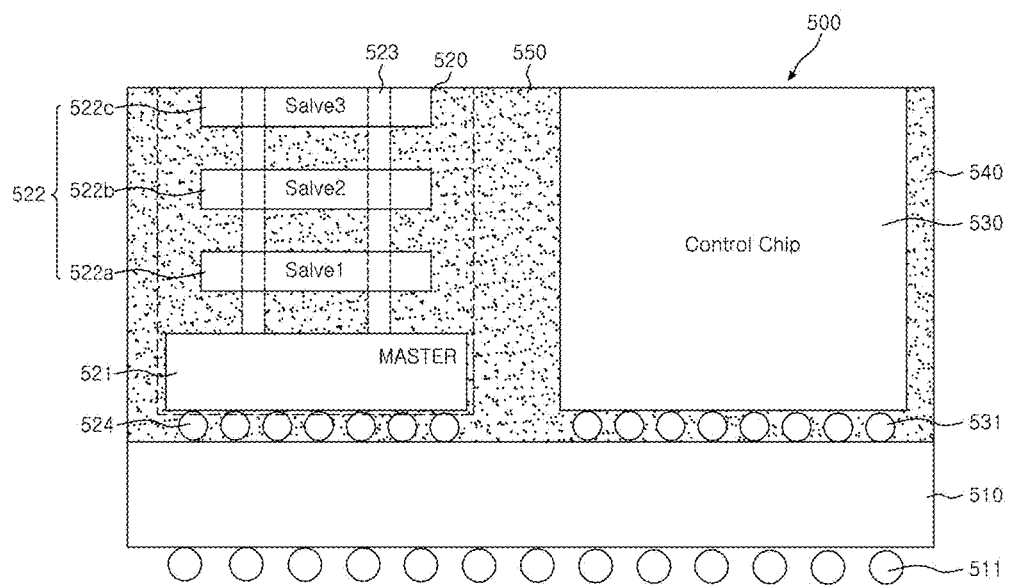
FIG. 5 is a diagram illustrating the structure of a semiconductor package according to an embodiment of the invention.

Referring to FIG. 5, a semiconductor package 500 according to an embodiment of the invention may include an interposer 510, a semiconductor chip 520, a control chip 530, and a molding part 540.

The interposer 510 may be referred to as a semiconductor substrate. The interposer 510 may be configured to include conductive patterns (not illustrated) to electrically couple the semiconductor chip 520 and the control chip 530. The interposer 510 may be electrically coupled to an external circuit through a bump 511. At the outermost part of the interposer 510, a guard unit may be formed to protect the semiconductor package.

The semiconductor chip 520 may be disposed at one side of the top surface of the interposer 510. The semiconductor chip 520 may also serve to store data according to control of the control chip 530. The semiconductor chip 520 may include a master chip 521, first to third slave chips 522a to 522c, and a TSV 523. The first to third slave chips 522a to 522c may be configured to be stacked over the master chip 521. The TSV 522 may be formed through the first to third slave chips 522a to 522c. The master chip 521 may also have a larger size than the plurality of slave chips 522 because one guard unit is formed at the master chip 521 and another guard unit is formed at each of the slave chips 522a to 522c to reduce a package defect caused by moisture or crack. The guard units will be described with reference to FIG. 6.

The control chip 530 may be disposed at the other side of the top surface of the interposer 510. The control chip 350 may also serve to control overall operations of the semiconductor chip 520. The control chip 530 may also be electrically coupled to the interposer 510 through a control chip bump 531. Furthermore, a guard unit to protect the control chip 530 may be formed at the outermost part of the control chip 530. FIG. 5 also includes a control chip bump 524 electrically coupled to the master chip 521.

The molding part 540 may be configured to serve to cover the top surface of the semiconductor package 500 according to an embodiment and protect the semiconductor chip 520 and the control chip 530 from the external environment.

Figure 6:
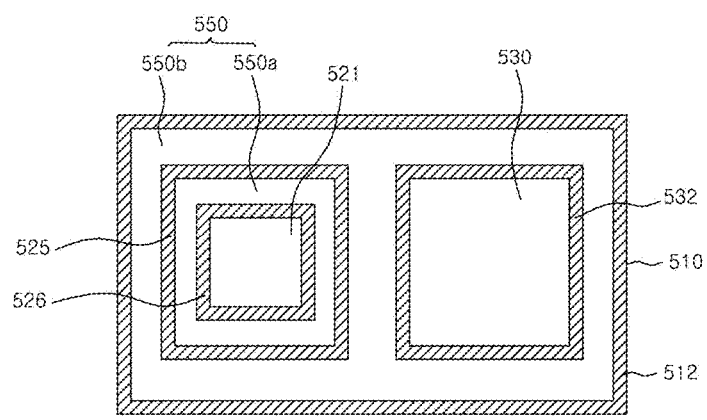
FIG. 6 is a diagram illustrating first to fourth guard units and a dummy pattern part of the semiconductor package according to an embodiment of the invention.

Referring to FIG. 6, the semiconductor package 500 according to an embodiment of the invention may include a first guard unit 512, a second guard unit 525, a third guard unit 526, a fourth guard unit 532, and a dummy pattern part 550. The first guard unit 512 may be configured to be formed at the outermost part of the interposer 510. The second guard unit 525 may be configured to be formed at the outermost part of the master chip 521 of the semiconductor chip 520. The third guard unit 526 may be configured to be formed at each of the slave chips 522 of the semiconductor chip 520. The fourth guard unit 532 may be configured to be formed at the outermost part of the control chip 530. The dummy pattern part 550 may serve to make up for a difference in height or size among the guard units 512, 525, 526, and 532 accordingly.

The third guard unit 526 of the semiconductor chip 520 may be configured to be formed to such a height to allow the slave chips 522 to be stacked. Furthermore, the second and third guard units 525 and 526 of the semiconductor chip 520 may be formed at a first distance from each other. In addition, the first distance may correspond to a difference in size between the master chip 521 and the slave chips 522. In order to make up for such a size difference, a first dummy pattern part 550a may be formed as a result. Furthermore, a second dummy pattern part 550b may also be formed in spaces among the interposer 510, the semiconductor chip 520, and the control chip 530. The first to fourth guard units 512 to 532 may have substantially the same structure as described with reference to FIG. 3. In addition, the dummy pattern part 550 may also have substantially the same structure as described with reference to FIG. 4. Thus, the detailed descriptions thereof are omitted.

The semiconductor packages 100 and 500 according to the embodiments of the invention may include two or more guard units disposed therein. Therefore, since the semiconductor packages 100 and 500 can be protected through a double or triple protection structure, it is possible to reduce defects of the semiconductor package 100, caused by moisture or crack accordingly.

Figure 7:
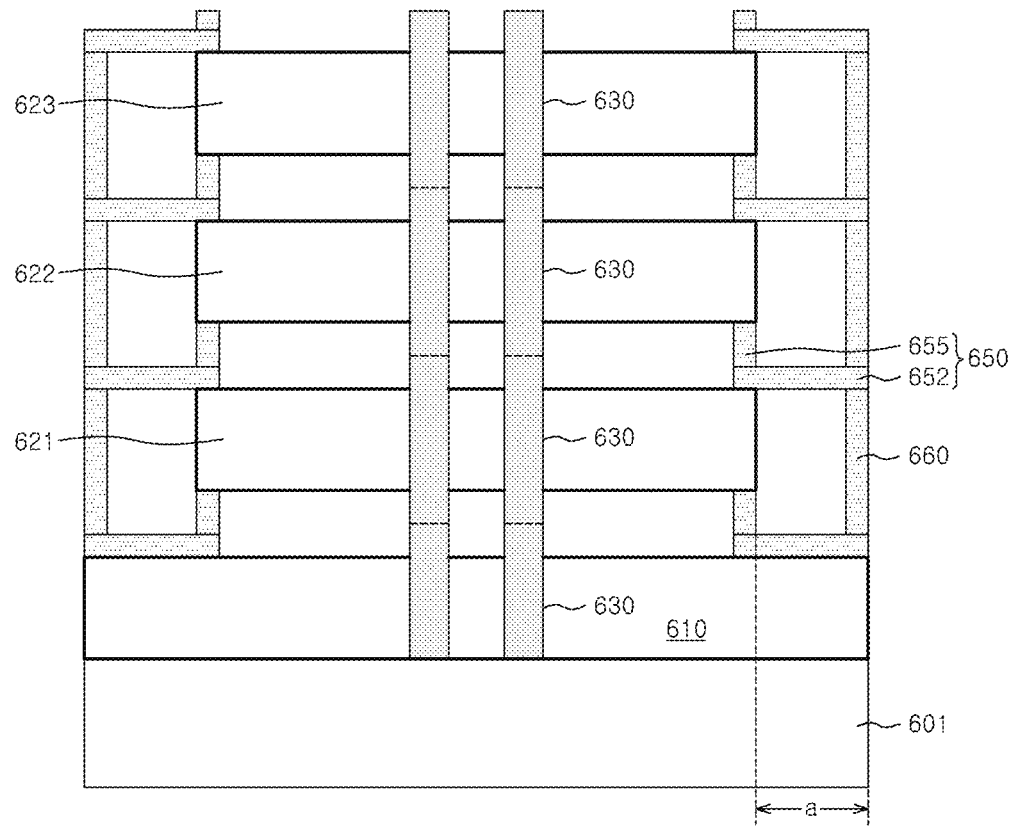
FIG. 7 is a cross-sectional diagram illustrating a semiconductor package according to an embodiment of the invention.

FIG. 7 is a cross-sectional diagram illustrating a semiconductor package 600 according to an embodiment of the invention.

Referring to FIG. 7, the semiconductor package 600 may include a package substrate 601, a master chip 610, and a plurality of slave chips 621, 622, and 623.

The master chip 610 may be mounted on the package substrate 601.

The plurality of slave chips 621 to 623 may be sequentially stacked over the master chip 610 and for example, the plurality of slave chips 621 to 623 may have the same size as each other. For example, the plurality of slave chips 621 to 623 may have a smaller size than the master chip 610. The plurality of slave chips 621 to 623 may be NAND flash chips as a storage medium.

TSVs 630 may be formed in the insides of the master chip 610 and the plurality of slave chips 621 to 623. The TSVs 630 may be formed through the insides of the semiconductor chips 610 and 621~623 to electrically couple signal terminals of the chips 610 and 621 to 623 and external signal terminals. To easily couple TSVs 630 having the same function of the chips 610 and 621 to 623, the chips 610 and 621 to 623 may be disposed so that the TSVs 630 having the same function correspond to each other. The same function may refer to a function to input/output the same signal or the same address. Although not shown in drawing, TSVs 630 of different chips corresponding to each other may be electrically coupled through bumps (not shown).

The semiconductor package 600 according to an embodiment of the invention may include a first guard unit 650 and a second guard unit 660.

The first guard unit 650 may be located in an edge of each of the slave chips 621 to 623. The first guard unit 650 may include an extension pad 652 and a vertical guard ring unit 655.

The extension pad 652 may extend from the edge of each of the slave chips 621 to 623 to an edge of the master chip 610 adjacent thereto to have a predetermined linewidth a. For example, the extension pad 652 may extend from a top surface of each of the slave chips 621 to 623. The extension pad 652 may be further formed on a surface of the master chip 610 exposed through the slave chips 621 to 623. The extension pad 652 may be simultaneously formed when conductive layers or metal layers are formed over the slave chips 621 to 623 and the master chip 610. The extension pad 652 may serve to extend the sizes of the slave chips 621 to 623 having a relatively small size so that the sizes of the slave chips 621 to 623 corresponds to the size of the master chip 610 having a relatively large size.

The vertical guard ring unit 655 may extend from an inner edge of the extension pad 652 toward an edge of a bottom of each of the slave chips 621 to 623. The vertical guard ring unit 655 may be formed in the edge of each of the slave chips 621 to 623 in a wall form and may block impurities and moisture from the outside.

Figure 8:
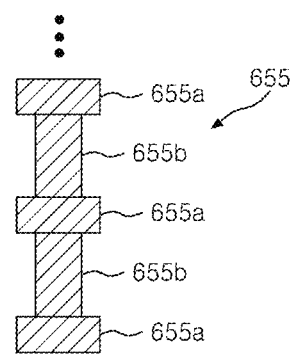
FIG. 8 is a detailed cross-sectional diagram illustrating a vertical guard ring unit according to an embodiment of the invention.

As illustrated in FIG. 8, the vertical guard ring unit 650 may be configured of conductive pads 655a and contact units 655b which are alternately stacked. The conductive pad 655a may be formed through the same process as a process for forming metal layers (not shown) constituting the slave chips 621, 622, and 623 and the contact units 655b may be formed through the same process as a process for forming conductive plugs (not shown) constituting the slave chips 621, 622, and 623.

The second guard unit 660 may be disposed in an outer part of the master chip 610. More specifically, the second guard unit 660 may be formed between outer edges of the extension pads corresponding to the edge of the master chip 610. The second guard unit 660 may also be formed to have the same form as the vertical guard ring unit 650. For example, a total height of the second guard units 660 may correspond to a height of from a surface of the master chip 610 to a surface of the uppermost slave chip 623. However, the second guard units 660 may be stably stacked through the extension pads 652 extending from the slave chips 621, 622, and 623.

In the embodiment, the first guard unit 650 surrounding the chip having a relatively small size and the second guard unit 660 surrounding the chip having a relatively large size may be formed. The semiconductor chip may be throughly protected through the formation of the double guard unit.

The extension pad may be formed to extend from the relatively small-sized chip to reduce the size difference between the chips and thus collapse of the guard ring may be reduced.

Figure 9:
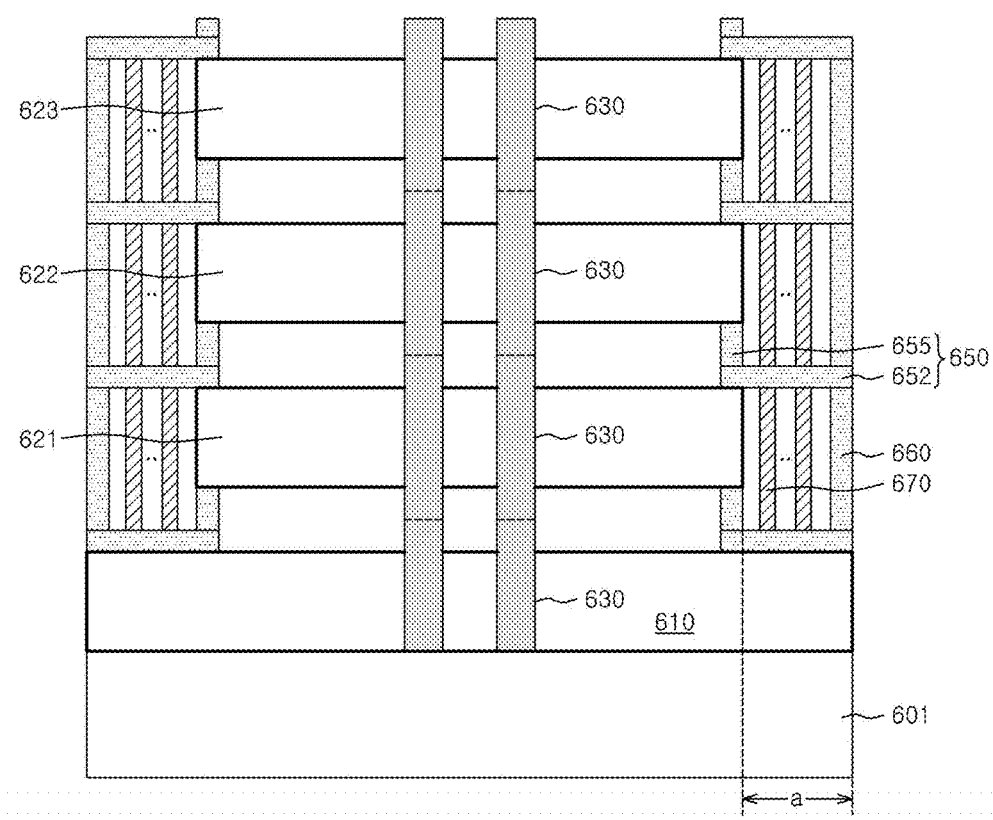
FIG. 9 is a cross-sectional diagram illustrating a semiconductor package according to an embodiment of the invention.

As illustrated in FIG. 9, a plurality of dummy patterns 670 may be arranged in a space between the first guard unit 650 and the second guard unit 660. The sinkage of the extension pad 652 may be prevented through the formation of the dummy patterns 670.

Figure 10:
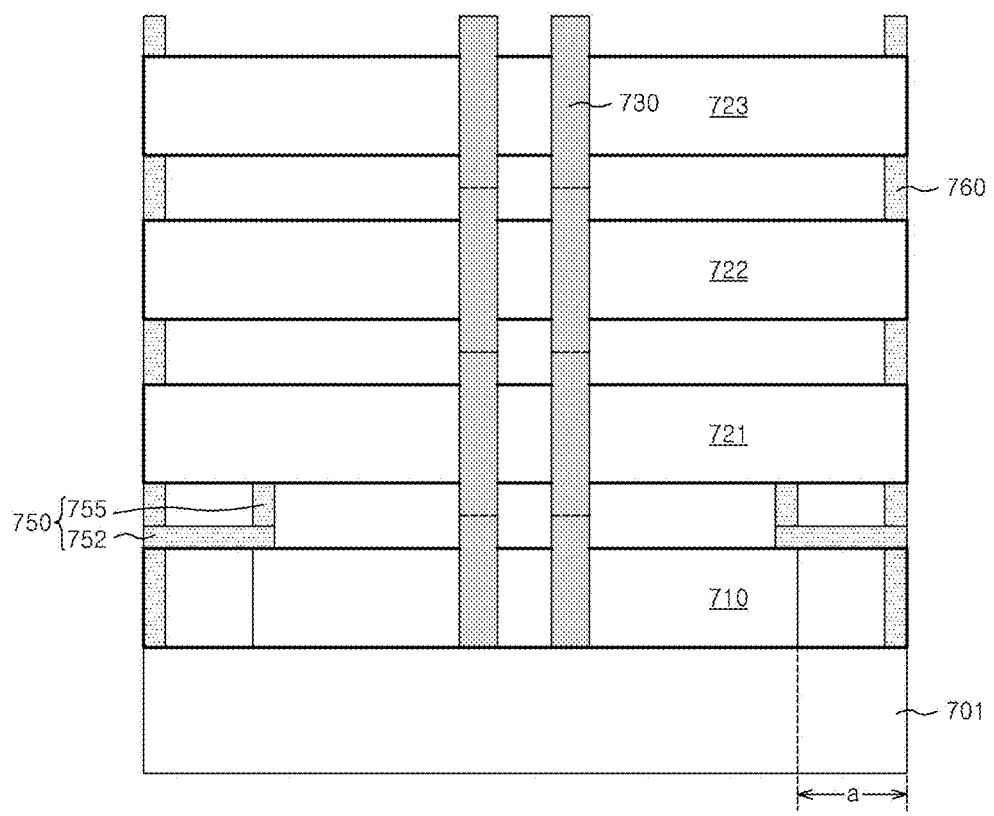
FIG. 10 is a cross-sectional diagram illustrating a semiconductor package according to an embodiment of the invention.

With the demand of the high-capacity semiconductor package, as illustrated in FIG. 10, slave chips 721, 722, and 723 having a larger size than a master chip 710 may be stacked over a master chip 710. Even in the semiconductor package having the above-described structure, the same signal terminals of the plurality of slave chips 721, 722, and 723 and the master chip 710 may be electrically coupled through TSVs 730. Accordingly, a distance difference a between an edge of the master chip 710 and edges of the slave chips 721, 722, and 723 may be generated.

A first guard unit 750 may be formed in an edge of the master chip 710 having a relatively small size and a second guard unit 760 may be formed in an edge of each of the slave chips 721, 722, and 723 having a relatively large size.

The first guard unit 750 may include an extension pad 752 and a vertical guard ring unit 755. For example, the extension pad 752 may extend from the edge of the master chip 710 to the edge of each of the slave chips 721, 722, and 723 to have a predetermined width a.

The vertical guard ring unit 755 may be formed from an inner edge of the extension pad 752 corresponding to the edge of the master chip 710 toward a bottom surface of the lowermost slave chip 721. The vertical guard ring unit 755 may be configured of conductive pads and contact units alternately stacked as illustrated in FIG. 8.

The second guard unit 760 may be formed in an outer part of each of the plurality of slave chips 721, 722, and 723 having a relatively large area. More specifically, the second guard unit 760 may be located between a package substrate 701 and an outer edge of the extension pad 752, between the outer edge of the extension pad 752 and an edge of the lowermost slave chip 721, and between edges of the slave chips 721, 722, and 723. Similarly to the vertical guard ring unit 755, the second guard unit 760 may be configured of a plurality of conductive pads and a plurality of conductive plugs alternately stacked.

Figure 11:
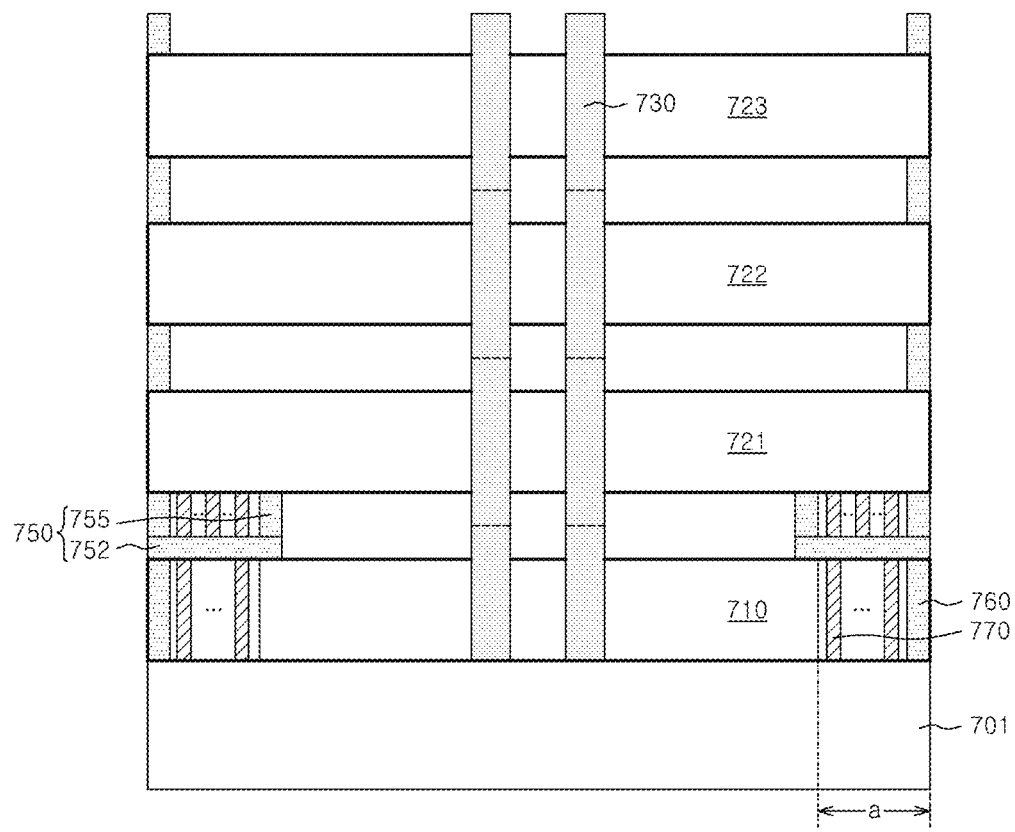
FIG. 11 a cross-sectional diagram illustrating a semiconductor package according to an embodiment of the invention.

As illustrated in FIG. 11, a dummy pattern 770 may be further arranged between the first guard unit 750 and the second guard unit 760. For example, a plurality of dummy patterns 770 may be arranged in a space between the first guard unit 750 and the second guard unit 760, for example, between the package substrate 701 and the extension pad 752 and between the extension pad 752 and the lowermost slave chip 721.

In the embodiment, when the chips having different sizes from each other are stacked, the guard unit having the double structure may be arranged by forming the guard units in an edge of the chip having a relatively small size and an edge of the chip having a relatively large size.

The guard ring including the extension pad may be formed to reduce the size difference between the small-sized chip and the large-sized chip and thus the problem caused due to the size difference between the chips may be overcome.

In the embodiment, the extension pad may be formed to have a structure that included in the guard ring of the small-sized chip and extends from the small-sized chip to the large-sized chip, but this is not limited thereto. The extension pad having a structure that is included in the large-sized chip and extends from the large-sized chip to the small-sized chip may be formed.

In the embodiment, the structure that the master chip is located in a lower side and the slave chips are stacked over the master chip has been described, but this is not limited thereto and the master chip may be stacked over the slave chip.

Figure 12:
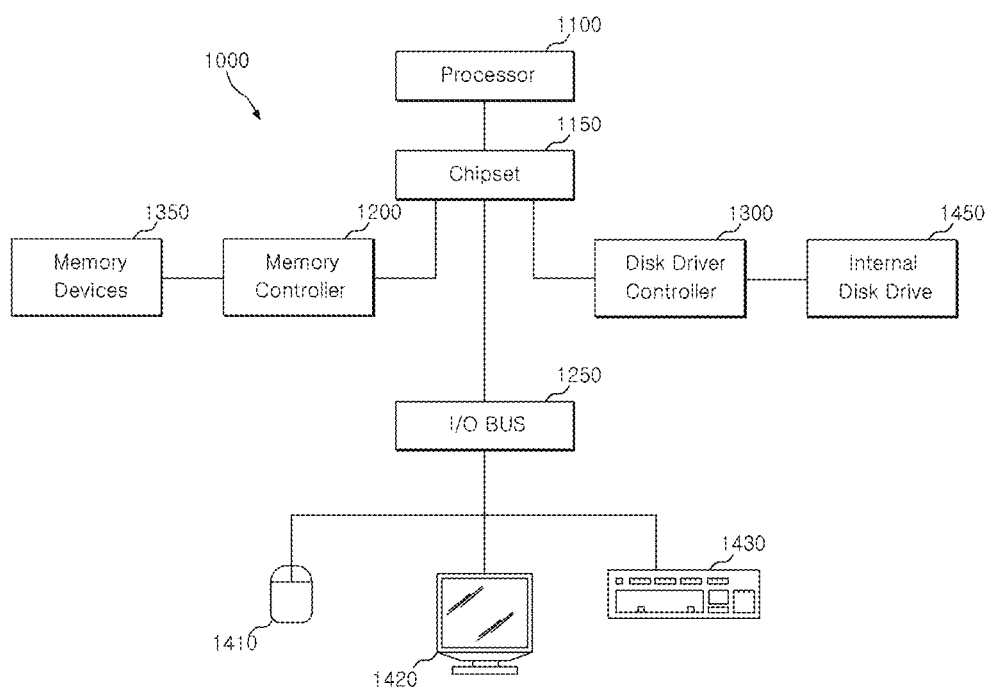
FIG. 12 illustrates a block diagram of a system employing a memory controller circuit in accordance with an embodiment of the invention.

Referring to FIG. 12, a system 1000 may include one or more processors 1100. The processor 1100 may be used individually or in combination with other processors. A chipset 1150 may be electrically coupled to the processor 1100. The chipset 1150 may be a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor package 100 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of example only. Accordingly, the semiconductor package described should not be limited based on the described embodiments. Rather, the semiconductor package described should only be limited in light of the claims that follow when taken in conjunction with the above description and accompanying figures.

What is claimed is:

1. A semiconductor package comprising:
   a first chip;
   a plurality of second chips stacked over the first chip and having a bigger size than the first chip;
   a first guard unit positioned on the first chip, the first guard unit including an extension pad which expands the size of the first chip to the size of the second chips and a vertical guard ring for connecting a backside of the second chip with an inner edge of the extension pad ; and
   a second guard unit positioned between an outer edge of the extension pad and the outer edge of a backside of the lowest second chip, and between edges of the second chips.

2. The semiconductor package according to claim 1, wherein the vertical guard ring unit is configured of a plurality of conductive pads and a plurality of conductive plugs alternatively stacked.

3. The semiconductor package according to claim 1, wherein the second guard unit is configured of a plurality of conductive pads and a plurality of conductive plugs alternatively stacked.

4. The semiconductor package according to claim 1, wherein a plurality of dummy patterns are interposed between the first guard unit and the second guard unit.

5. A semiconductor package comprising:
   a package substrate;
   a master chip mounted on the package substrate;
   a plurality of slave chips stacked over the master chip and having a size bigger than that of the master chip;
   through silicon vias (TSVs) formed through insides of the master chip and the plurality slave chips;
   a first guard unit formed to surround an edge of the master chip; and
   a second guard unit formed to surround each of the plurality of slave chips,
   wherein the first guard unit includes an extension pad which expands an area of the master chip to areas of the slave chips, and a vertical guard ring unit vertically extending from an inner edge of the extension pad to a bottom surface of the slave chip.

6. The semiconductor package according to claim 5, wherein the master chip and the slave chips are stacked so that a TSV of the master chip and TSVs of the slave chips have the same function are corresponding to each other.

7. The semiconductor package according to claim 5, wherein the second guard unit is located between the package substrate and an outer edge of the extension pad, between an outer edge of the extension pad and a bottom surface of the slave chip, and between the outer edges of the slave chips.

8. The semiconductor package according to claim 5, wherein the first guard unit and the second guard unit includes conductive layers.

\* \* \* \* \*